United States Patent
Fujita (10) Patent No.: US 6,879,218 B2
(45) Date of Patent: Apr. 12, 2005

(54) FREQUENCY MODULATION CORRECTOR KEEPING A GOOD OSCILLATING SIGNAL QUALITY AND SUPPRESSING DEPENDABILITY OF A MODULATION DEGREE

(75) Inventor: Ken Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 121 days.

(21) Appl. No.: 10/458,750
(22) Filed: Jun. 11, 2003

(65) Prior Publication Data
US 2004/0041639 A1 Mar. 4, 2004

(30) Foreign Application Priority Data
Jun. 13, 2002 (JP) ........................................ 2002-172484

(51) Int. Cl.[7] .......................... H03L 7/099; H03B 5/00; H03B 5/12; H03C 3/08
(52) U.S. Cl. .............................. 331/23; 331/8; 331/17; 331/36 C; 331/177 V; 332/124; 332/127
(58) Field of Search ................................ 331/8, 16–18, 331/23, 25, 36 C, 177 V; 332/123, 124, 127, 128; 360/30, 51; 375/302, 376; 455/42, 110, 113

(56) References Cited

U.S. PATENT DOCUMENTS
4,378,534 A * 3/1983 Goedken et al. ............ 332/124

FOREIGN PATENT DOCUMENTS
JP 2001-196860 7/2001

* cited by examiner

Primary Examiner—David Mis
(74) Attorney, Agent, or Firm—Rabin & Berdo, P.C.

(57) ABSTRACT

A correction circuit for a voltage-controlled oscillator (VCO) is arranged outwardly of the voltage-controlled oscillator. The oscillation of the selected frequency and the frequency modulation are carried out independently of each other. The correction circuit includes a frequency selection controller generating a frequency selection signal of the DC potential, and a frequency modulation controller generating a modulation adjusting signal responsive to the input of a modulating signal. When a frequency modulation control signal, including the DC potential of the frequency selection signal and the modulation adjusting signal, is supplied to the voltage-controlled oscillator, the capacitance is lowered even if the frequency is increased, thus allowing the modulation degree to frequency to be decreased to a substantially constant level.

9 Claims, 9 Drawing Sheets

FREQUENCY MODULATION CORRECTOR KEEPING A GOOD OSCILLATING SIGNAL QUALITY AND SUPPRESSING DEPENDABILITY OF A MODULATION DEGREE

BACKGROUND OF THE INVENTION

1. Field of the Invention

The present invention relates to a frequency modulation corrector and, more particularly, to a circuit for correcting the modulation degree to frequency in for example a voltage-controlled oscillator (VCO).

2. Description of the Background Art

In general, a voltage-controlled oscillator, used in a wireless device of a conventional direct frequency modulation system, may be represented by an equivalent circuit including, as a resonant circuit, a fixed inductor, a first variable capacitor element for selecting the carrier frequency and a second variable capacitor element responsible for frequency modulation. The first and second variable capacitor elements are connected in parallel to each other. The voltage-controlled oscillator also includes an amplifier circuit for use in oscillating the resonant circuit. The voltage-controlled oscillator, formed by this resonant circuit, selects the carrier frequency by the direct current (DC) potential applied to the first variable capacitor element, while setting a modulation degree to frequency by the DC potential applied to the second variable capacitor element.

In the voltage-controlled oscillator, the capacitance value of the first variable capacitor element is fixed, during data transfer, as the capacitance value of the second variable capacitor element is changeable in response to a data pattern. It should be noted that the second variable capacitor element is controlled in such a manner that the voltage applied across the element is varied with time to cause changes in the capacitance value. This circuit structure, however, suffers from a deficiency that the modulation degree to frequency is increased with the increasing carrier frequency.

Let the frequency of the carrier wave, the inductance of the inductor, the capacitance value of the variable capacitor element determining the carrier frequency and the capacitance value of the other variable capacitor element responsible for frequency modulation be f, L, C and $C_{MOD}$, respectively. Since the oscillation frequency f is given by $f = \frac{1}{2\pi} \{(C_i + C_{MOD})L\}^{-1/2}$, the modulation degree to frequency $(\Delta f)_i$ for the carrier frequency $f_i$ may be expressed by an approximation:

$$(\Delta f)_i / f_i = -(1/2) \times (\Delta C_{MOD})_i / (C_i + (\Delta C_{MOD})_i) \approx -(1/2) \times (\Delta C_{MOD})_i / C_i. \quad (1)$$

It should be noted that the approximation of the expression (1) becomes possible by the fact that the capacitance value $C_i$ of the variable capacitor element determining the carrier frequency f is usually larger by two orders of magnitude than the capacitance value $(\Delta C_{MOD})_i$ of the other variable capacitor element responsible for frequency modulation. For the case of a carrier wave of different frequencies $f_1$ and $f_2$, the ratio of the modulation degrees to frequency $(\Delta f)_1$ and $(\Delta f)_2$ is given by $$(\Delta f)_2 / (\Delta f)_1 = (f_2/f_1) \times (C_1/C_2) \times [(\Delta C_{MOD})_2 / (\Delta C_{MOD})_1] = (f_2/f_1)^3 \times [(\Delta C_{MOD})_2 / (\Delta C_{MOD})_1], \quad (2)$$

by applying the approximation.

In the conventional circuit system, a preset DC potential is applied to a variable capacitor element, having the variable capacitance value $\Delta C_{MOD}$, the ratio of the modulation degrees to frequency is proportionate to the third power of the ratio of the carrier frequencies, as indicated by the expression (2). For example, if a conventional direct frequency modulation circuit is used in the restricted radiation frequency band for industrial, scientific and medical equipment (f=2.4 to 2.5 GHz), the modulation degree to frequency for 2.5 GHz is larger than that for 2.4 GHz by a factor of $(2.5/2.4)^3 = 1.130$. This carrier frequency dependency of the modulation degree to frequency may practically not be discounted, such that the modulation degree to frequency needs to be constant without dependency on the carrier frequency. For this reason, the variation of the variable capacitance which affords the frequency modulation must be controlled in dependence upon the carrier frequency defined by the expression (3) to maintain the relationship:

$$(\Delta C_{MOD})_2 = (f_1/f_2)^3 \times (\Delta C_{MOD})_1. \quad (3)$$

Among more specified instances for suppressing the changes in the modulation degree to frequency, there is a voltage-controlled oscillator described in the Japanese Laid-Open Patent Publication No. 2001-196860. In this voltage-controlled oscillator, there is provided, in addition to the first variable capacitor element determining the carrier frequency and the second variable capacitor element responsible for the frequency modulation, a third variable capacitor element, connected in parallel with the first and second variable capacitor elements, and both the alternate current (AC) signal for frequency modulation and the DC signal determining the carrier frequency are applied to the third variable capacitor element to correct the aforementioned effect proportionate to the third power of the carrier frequency ratio by a ratio of the modulation degree to frequency.

Meanwhile, since the aforementioned Japanese Laid-Open patent Publication No. 2001-196860 uses, in addition to the first and second variable capacity elements used in the resonant circuit, the third variable capacitor element to compensate for the aforementioned effect, resulting in the resonant circuit being complicated in structure and bulky due to the additional constituent element.

Not only is the third variable capacitor element added in the resonant circuit, but also a resistor is introduced, as a result of provision of the third variable capacitor element, across the first and third variable capacitor elements. This resistor is used for decreasing the DC voltage applied to the third variable capacitor element. As aforesaid, this DC voltage determines the carrier frequency. Moreover, a fixed capacitor element has to be connected across the second and third variable capacitor elements. The purpose of providing this fixed capacitance is to prevent the DC voltage, determining the carrier frequency, from being applied to the second variable capacitor element.

In this technique, applied for suppressing the carrier frequency dependency of the modulation degree to frequency, the resistor, introduced as described above, and a resistance component of the third variable capacitor element, operate as a noise source of an oscillator, as a result of which noise characteristics, represented by for example the signal-to-noise (S/N) ratio, are deteriorated. This deterioration of the noise characteristics is not such as may be tolerated in the case of the oscillator implemented in the form of a semiconductor integrated circuit. Specifically, the oscillator, implemented as a semiconductor integrated circuit, is designed to satisfy the specifications of the noise characteristics with only a narrow allowance under such constraint as reduction of the occupied space or suppression of the power consumption and under such a condition in which there is provided neither the third variable capacitor element nor the resistor. In other words, this designing introducing the third variable capacitor element and the resistor would cause no room to be left for tolerating the rise in noise level.

If nevertheless the designing is changed to introduce the third variable capacitor element and the resistor and to meet the specifications for the noise characteristics in the oscillator or resonant circuit, the space occupied or the power consumption would be increased, so that the competitive power of the product is lost.

SUMMARY OF THE INVENTION

It is an object of the present invention to overcome the defects of the conventional technique and to provide a frequency modulation corrector in which it is possible to suppress the carrier frequency dependency of the modulation degree to frequency with the noise characteristics of the oscillator kept at an optimum level even though the modulation degree to frequency remains uncorrected.

In accordance with the present invention, a frequency modulation corrector for use with a voltage-controlled oscillator including a parallel connection of a first capacitor element having a capacitance changeable with a first control voltage signal controlling the oscillation frequency and a second capacitor element having a capacitance changeable with a second control voltage signal controlling the frequency modulation comprises a frequency setting circuit for generating and outputting DC signals based on a predetermined reference voltage signal and on a voltage signal which is in keeping with a desired frequency, a modulation degree setting circuit for amplifying AC signals and for generating and outputting an modulation adjusting signal used for controlling the degree of the frequency modulation, and a signal summation circuit for summing the DC signals and the modulation adjusting signal to generate and output the second control voltage signal. The frequency modulation corrector is arranged outwardly of the voltage-controlled oscillator.

The frequency modulation corrector of the present invention is thus arranged outwardly of the voltage-controlled oscillator. In order that the oscillation of the selected frequency and the frequency modulation will be carried out independently of each other, a DC signal is generated in the frequency setting circuit, and the modulation adjusting signal, not dependent on the DC signal, is generated in the modulation degree setting circuit. The DC signal and the modulation adjusting signal are summed in the signal summation circuit which then sends out a second control voltage signal to a voltage-controlled oscillator to be controlled. The voltage-controlled oscillator is responsive to the increasing frequency to lower the capacitance of the second capacitor element to decrease the modulation degree to maintain the modulation degree to frequency at a substantially constant value. In this manner, noise characteristics of the oscillation circuit may be maintained at an optimum level, even in the absence of the correction in the modulation degree to frequency, thereby suppressing the carrier frequency dependency of the modulation degree to frequency as well as providing tolerance for noise increase.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Referring to the drawings, preferred embodiments of a frequency modulation corrector according to the present invention will be described in detail. In the present embodiment, the frequency modulation corrector of the invention is applied to a correction controller 10 for a voltage-controlled oscillator (VCO) 100. The parts or components irrelevant to understanding the present invention are not shown nor described. In the following description, the reference numerals designating connection lines also indicate signals appearing thereon.

Figure 1:
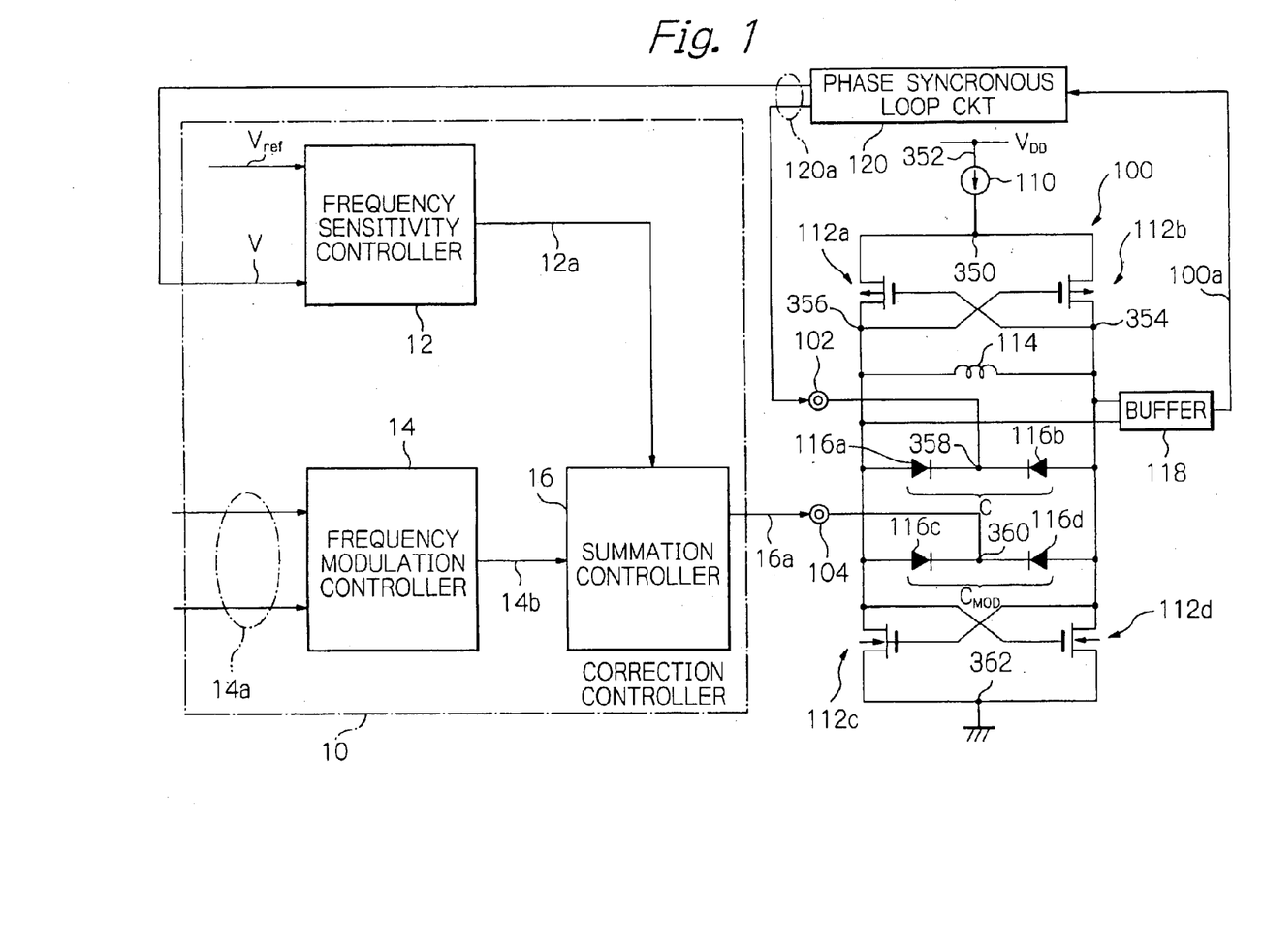
FIG. 1 is a schematic block diagram showing the arrangement and configuration of a correction controller, to which has applied a frequency modulation corrector of the present invention, and a voltage-controlled oscillator to be corrected.

The correction controller 10 is featured especially by being provided outside the voltage-controlled oscillator 100, as shown in FIG. 1. With this arrangement of the voltage-controlled oscillator 100, noise characteristics of the oscillator are maintained at a level which prevails when the correction of the modulation degree to frequency is not performed. The voltage-controlled oscillator 100 may be represented by an equivalent circuit of a resonant circuit 200 shown in FIG. 2. Using the variables, as used above, the resonant circuit 200 includes a fixed inductor L, a first variable capacitor element C for selecting the carrier frequency, and a second variable capacitor element $C_{MOD}$ providing frequency modulation of the carrier frequency. As may be seen from FIG. 2, the first variable capacitor element C and the second variable capacitor element $C_{MOD}$ are connected parallel to each other. The configuration of the voltage-controlled oscillator 100 will be described later in detail.

Reverting to FIG. 1, the correction controller 10 includes a frequency sensitivity controller or frequency setting circuit 12, a frequency modulation controller or modulation degree setting circuit 14 and a summation controller or signal superposing circuit 16. The frequency sensitivity controller 12 is supplied with a reference voltage signal $V_{ref}$ from a reference voltage provided in an integrated circuit (IC) chip, not shown, on which is also mounted the present corrector. The reference voltage signal $V_{ref}$ is a constant voltage not dependent on the temperature or on the power supply voltage. The frequency sensitivity controller 12 is supplied with a DC voltage V (120a) which is applied to the first variable capacitor element C to control the carrier frequency of the voltage-controlled oscillator 100. The DC voltage V (120a) is a signal obtained on processing a signal, taken out as an output signal 100a of the voltage-controlled oscillator 100 as later described, with phase synchronous looping, followed by frequency selection. This DC voltage is also supplied to the voltage-controlled oscillator 100 via input terminal 102 as a first control voltage signal. The frequency sensitivity controller 12 outputs the generated DC potential as a frequency sensitivity control signal 12a to the summation controller 16.

Figure 3:
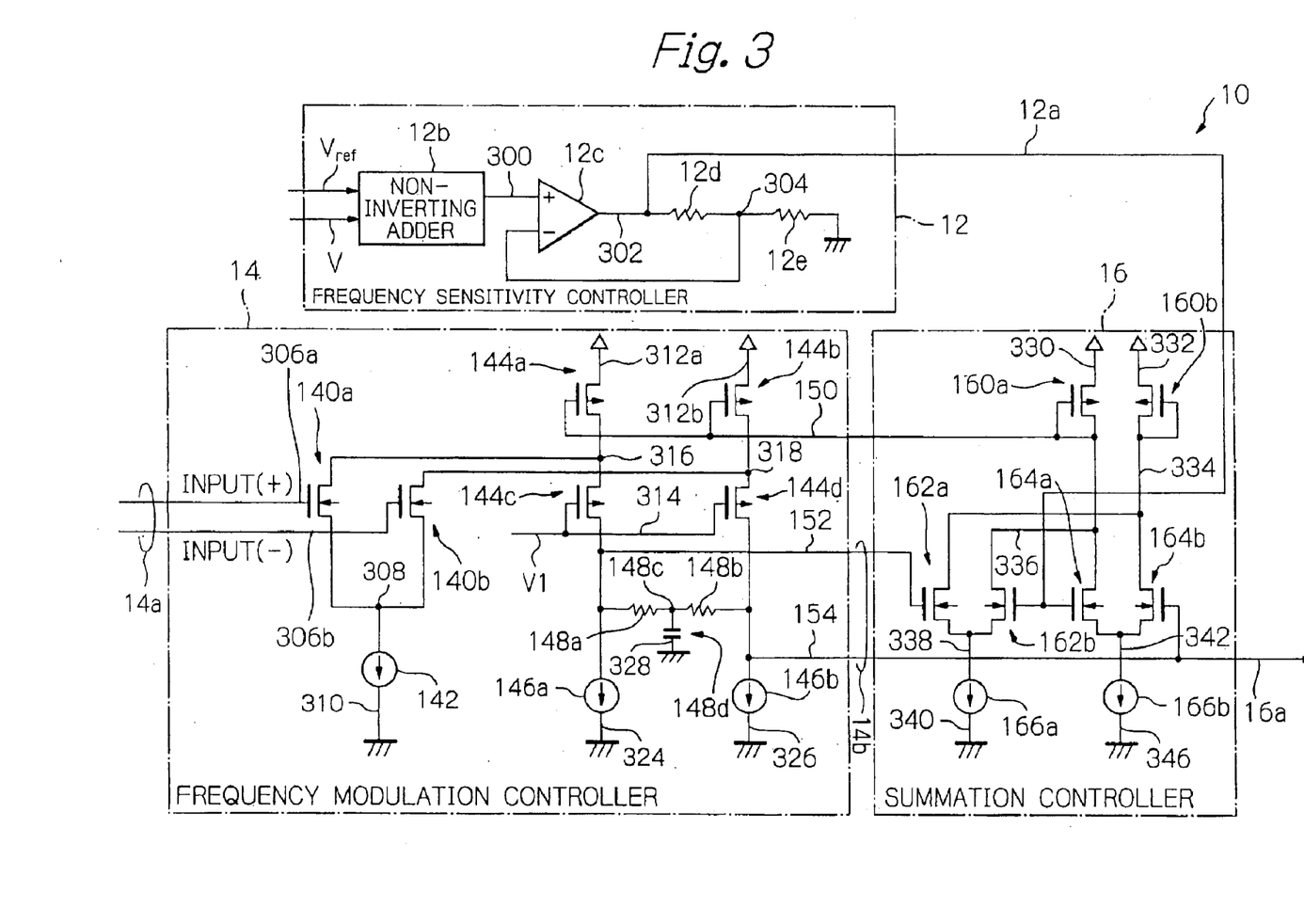
FIG. 3 is a schematic circuit diagram showing a more specified configuration of the correction controller shown in FIG. 1.

The frequency sensitivity controller 12 includes a non-inverting adder 12b, an operational amplifier 12c and resistors 12d, 12e, as shown in FIG. 3. Although not shown in detail, the non-inverting adder 12b is a non-inverting amplifier adapted to be supplied with the aforementioned two inputs, namely the reference voltage signal $V_{ref}$ and the DC voltage V. The non-inverting adder 12b sums these two input signals and suitably applies weighting in dependence upon a resistance ratio used for non-inverting amplification to output the resulting sum signal to a non-inverting (+) terminal 300 of the operational amplifier 12c.

The operational amplifier 12c has its output 302 connected to one end of the resistor 12d. The resistor 12d is connected in series with the resistor 12e which has its one end 304 grounded. The operational amplifier 12c is connected so that a voltage divided from a mid point 304 of a connection path across the resistors 12d and 12e will be applied to its inverting (−) terminal. The operational amplifier 12c performs non-inverting amplification with an amplification factor represented by the ratio of the resistance of the resistors 12d and 12e. The frequency sensitivity controller 12 outputs to the summation controller 16 the frequency sensitivity control signal 12a non-inverting amplified by the operational amplifier to an optimum DC potential for application to the second variable capacitor element $C_{MOD}$ which is responsible for frequency modulation of the voltage-controlled oscillator 100. In the present embodiment, the DC potential of the frequency sensitivity control signal 12a is selected to 1.8 volts (V) corresponding to the minimum temperature dependency of the voltage-controlled oscillator.

Reverting again to FIG. 1, the frequency modulation controller 14 is supplied with an AC signal having the polarity alternating at predetermined time intervals (inputs (+) and (−)), as in the form of modulating signal 14a. The frequency modulation controller 14 has the function of controlling the amplitude of the AC signal applied to the second variable capacitor element $C_{MOD}$. The frequency modulation controller 14 provides the summation controller 16 with a signal 14b for adjusting modulation. Specifically, the frequency modulation controller 14 is designed as a differential amplifier circuit, comprised of plural PMOS (P-type metal oxide semiconductor) and plural NMOS (N-type metal oxide semiconductor) transistors, interconnected as shown in FIG. 3. The PMOS and NMOS transistors are field-effect transistors, respectively.

The circuitry is now described with an eye directed to the connection of respective components. Two NMOS transistors 140a and 140b are arranged in an input stage of the frequency modulation controller 14. An input signal having the positive (+) polarity of a modulating signal 14a is supplied to a gate electrode 306a of the NMOS transistor 140a, while an input signal having the negative (−) polarity of the modulating signal 14a is supplied to a gate electrode 306b of the NMOS transistor 140b. The NMOS transistors 140a and 140b have source electrodes 308 connected in common to a constant current source circuit 142, which has its the other terminal 310 grounded.

The differential amplifier circuit following thereto to form an output stage includes four PMOS transistors 144a, 144b, 144c and 144d. The PMOS transistors 144a and 144b have source electrodes 312a and 312b connected to a power supply line $V_{DD}$. The transistor set of the PMOS transistors 144a and 144b has gate electrodes 150 connected in common, while the transistor set of the PMOS transistors 144c and 144d has also gate electrodes 314 connected in common. To the gate electrodes 314 in the set of the PMOS transistors 144c and 144d, a bias voltage, V1, is applied for setting the frequency f1, which is for example, 1.80 volts (V). The PMOS transistor 144a has its drain electrode 316 connected to the source electrode of the PMOS transistor 144c, while the PMOS transistor 144b has its drain electrode 318 connected to the source of the PMOS transistor 144d. The drain electrode 316 of the NMOS transistor 140a is connected to a junction point of a connection path of the drain electrode of the PMOS transistor 144a with the source electrode of the PMOS transistor 144c. Similarly, the drain electrode 318 of the NMOS transistor 140b is connected to a junction point of a connection path of the drain electrode of the PMOS transistor 144b with the source electrode of the PMOS transistor 144d.

The PMOS transistors 144c and 144d have drain electrodes 152 and 154 connected to constant current source circuits 146a and 146b, respectively, which have the other terminals 324 and 326 grounded, respectively. A series connection of resistors 148a and 148b connects the drain electrodes 152 and 154 of the PMOS transistors 144c and 144d. The series of resistors 148a and 148b has its junction point 148c connected to a capacitor 148d, which has its other plate 328 grounded.

The gate electrodes 150 of the PMOS transistors 144a and 144b are connected to the gate electrode and the drain electrode of a PMOS transistor 160a of the summation controller 16 via the common signal line denoted with the same reference numeral 150. The drain electrode 152 of the PMOS transistor 144c is connected via the signal line 152 to the gate electrode of an NMOS transistor 162a of the summation controller 16. The drain electrode 152 of the PMOS transistor 144d is connected over the signal line 154 to the gate electrode of an NMOS transistor 164b of the summation controller 16. The signal 14b for adjusting modulation is associated with the signal lines 152 and 154, while a frequency modulation controlling signal 16a is associated with the signal line 154.

The amplification factor in the frequency modulation controller 14 is adjusted with resistance values of the resistors 148a and 148b. The frequency modulation controller 14 determines the amplitude of the modulation adjusting signal 14b with the amplitude of the modulating signal (AC signal) 14a and with the resistance values of the resistors 148a and 148b. The frequency modulation controller 14 outputs signals, differentially amplified depending on the polarity of the applied modulating signal 14a, to the summation controller 16 over signal lines 152 and 154.

Figure 2:
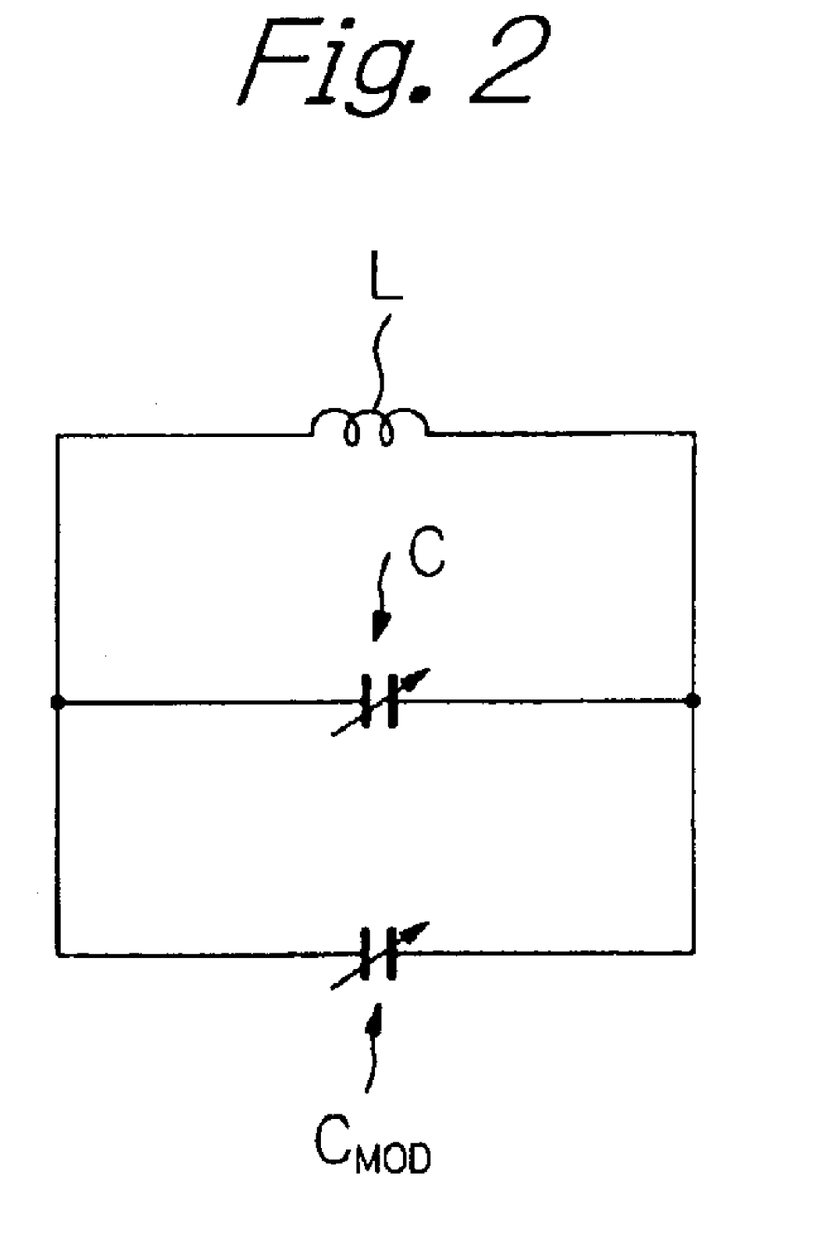
FIG. 2 shows an equivalent circuit for a resonant circuit used in the voltage-controlled oscillator shown in FIG. 1.

The summation controller 16 forms a common mode feedback (CMFB) circuit having two PMOS transistors 160a and 160b, four NMOS transistors 162a, 162b, 164a and 164b and two constant current source circuits 166a and 166b, interconnected as shown in FIG. 3. The summation controller 16 is supplied with the modulation adjusting signal 14b and with the frequency sensitivity control signal 12a to generate a frequency modulation control signal 16a, which is supplied via input terminal 104 to the second variable capacitor element $C_{MOD}$ of the voltage-controlled oscillator 100, as seen in FIG. 2.

Both the PMOS transistors 160a and 160b have source electrodes 330 and 332 connected to the power supply line $V_{DD}$. As aforesaid, the signal line 150 from the frequency modulation controller 14 is connected to a path short-circuiting the gate and drain electrodes of the PMOS transistor 160a. The gate and drain electrodes of the PMOS transistor 160b are also short-circuited with a path 443 as shown.

The signal line 152 corresponding to one of the output signals of the frequency modulation controller 14 is connected to the gate electrode of the NMOS transistor 162a. The NMOS transistor 162a has its drain electrode connected to the drain electrode 334 of the PMOS transistor 160b, while the NMOS transistor 162b has its drain electrode 336 connected to the drain electrode of the PMOS transistor 160a. The NMOS transistors 162a and 164a have source electrodes 338 connected in common to a constant current source circuit 166a, which has its other terminal 340 grounded.

The NMOS transistor 164a is connected to the drain electrode 336 of the PMOS transistor 160a, while the NMOS transistor 164b is connected to the drain electrode 334 of the PMOS transistor 160b. The NMOS transistors 164a and 164b have source electrodes 342 connected in common to another constant current source circuit 166a, which has its other terminal 346 grounded. The NMOS transistors 162b and 164a have gate electrodes connected in common to be supplied with the frequency sensitivity control signal 12a from the frequency sensitivity controller 12. The signal line 154 for furnishing the other output signal of the frequency modulation controller 14 is connected to the gate electrode of the NMOS transistor 164b. The NMOS transistor 164b outputs a frequency modulation control signal 16a for providing the second variable capacitor element $C_{MOD}$ with an AC signal amplitude.

The summation controller 16 actuates the NMOS transistors 162b and 164a with a DC potential proper to the frequency sensitivity control signal 12a, thereby actuating not only the PMOS transistor 160a but also the PMOS transistors 144a and 144b of the frequency modulation controller 14 over signal line 150. The result is that the frequency modulation controller 14 sends out to the summation controller 16 an output changed at a frequency matched to the applied modulating signal 14a. More specifically, the summation controller 16 performs differential amplification as the AC signal as the modulating signal 14b is applied to the gate electrodes 152 and 154 of the NMOS transistors 162a and 164b, respectively. At this time, the summation controller 16 receives the modulating signals 14b, which is in turn supplied to the gate electrode 154 of the NMOS transistor 164b, and also outputs it to the voltage-controlled oscillator 100 as the frequency modulation control signal 16a. This frequency modulation control signal 16a is composed of a DC component, obtained on summing the DC component of the modulation adjusting signal 14b to the DC potential of the frequency sensitivity control signal 12a, and then adding an AC amplitude component to the resulting sum signal.

In the present embodiment, an output voltage of the CMFB circuit can be controlled to the range between 1.8 and 1.9 V, with the AC amplitude of the output kept constant at 0.9 V.

Reverting to FIG. 1, the structure of the voltage-controlled oscillator 100 is briefly described. The voltage-controlled oscillator 100 includes a constant current source circuit 110, PMOS transistors 112a and 112b, NMOS transistors 112c and 112d, an inductor 114 and diodes 116a, 116b, 116c and 116d. The PMOS transistors 112a and 112b have source electrodes 350 connected in common to the constant current source circuit 110, which has its other terminal 352 connected to the power supply line $V_{DD}$. The PMOS transistors 112a and 112b have gate electrodes 354 and 356, respectively, connected to the drain electrodes of the PMOS transistors 112b and 112a. The inductor 114 is connected across the drain electrodes 356 and 354 of the PMOS transistors 112a and 112b.

The diodes 116a and 116b are paired junction diodes equivalent to the first variable capacitor element C shown in FIG. 2. The diode 116a has its cathode 358 connected to the cathode of the diode 116b. The frequency sensitivity control signal 120a is applied via the input terminal 102 to the common junction of the two diodes 116a and 116b. The diode 116a has its anode 356 connected to the drain electrode of the PMOS transistor 112a. The other diode 116b has its anode 354 connected to the drain electrode of the PMOS transistor 112b.

Similarly, the diodes 116c and 116d are also paired junction diodes equivalent to the second variable capacitor element $C_{MOD}$ shown in FIG. 2. The diode 116c has its cathode 360 connected to the cathode of the diode 116d. The frequency modulation control signal 16a is applied via input terminal 104 to the common junction of the two diodes 116c and 116d. Also, the diode 116c has its anode 356 connected to the drain electrode of the PMOS transistor 112a. The other diode 116d has its anode 354 connected to the drain electrode of the PMOS transistor 112b.

The NMOS transistors 112c and 112d have drain electrodes 356 and 354 connected to the drain electrodes of the PMOS transistors 112a and 112b, respectively, with the source electrodes 362 the NMOS transistors 112c and 112d both being grounded as shown. The NMOS transistors 112c and 112d have gate electrodes 354 and 356 cross-connected as illustrated. More specifically, the gate electrode 354 of the NMOS transistor 112c is connected to the drain electrode 356 of the NMOS transistor 112d, while the gate electrode 356 of the NMOS transistor 112d is connected to the drain electrode 354 of the NMOS transistor 112c.

In the voltage-controlled oscillator 100, the signals obtained at the drain electrodes 356 and 354 of the PMOS transistors 112a and 112b, respectively, shown in FIG. 1 are output via buffer 118 to a phase synchronous loop circuit 120. The voltage-controlled oscillator 100 does not include a specific resistor device in this circuit, but holds noise characteristics of the oscillation circuit at an optimum level even without correcting the modulation degree to frequency.

The phase synchronous loop circuit 120 includes a loop filter for adjusting the phase of signals supplied and for looping the signals for achieving phase synchronization of the signals by way of accomplishing frequency selection. The phase synchronous loop circuit 120 sends out the frequency-selected signals 120a to the frequency sensitivity controller 12 and to the voltage-controlled oscillator 100.

Figure 4:
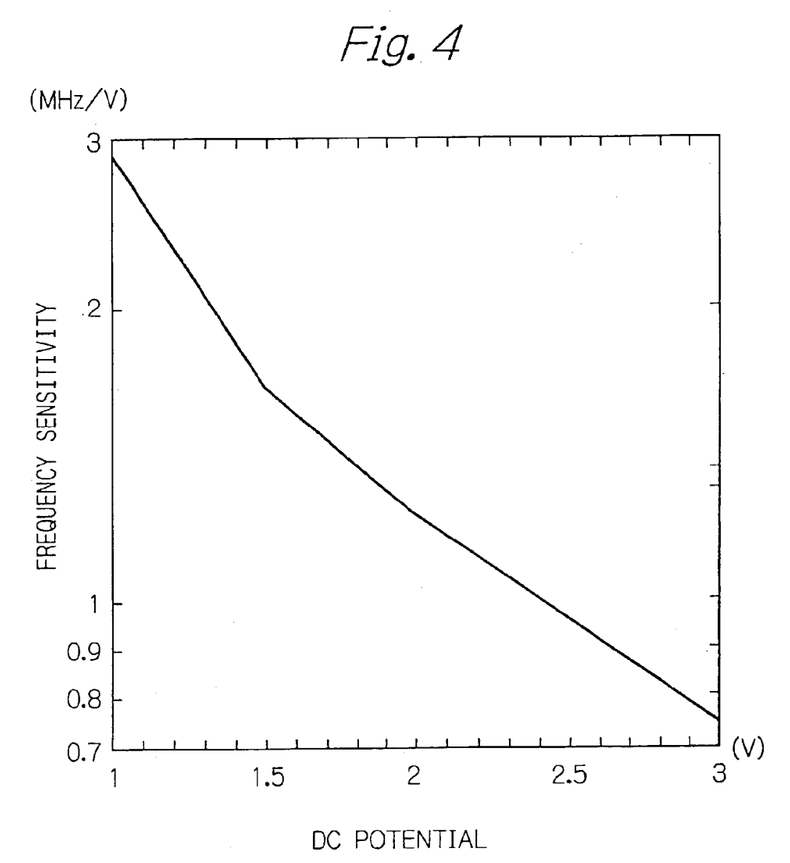
FIG. 4 is a graph plotting the frequency sensitivity of the voltage-controlled oscillator with respect to the DC potential in modulation in the correction controller shown in FIG. 3.

The operation of the correction controller 10 is now described, referring to FIG. 4 as to the relation of the frequency sensitivity to the input DC potential. In FIG. 4, the abscissa and the ordinate denote the DC potential applied to the second variable capacitor element $C_{MOD}$ and the frequency sensitivity (MHz/V) of the second variable capacitor element $C_{MOD}$, respectively.

In the second variable capacitor element $C_{MOD}$ in the voltage-controlled oscillator 100, shown in FIG. 1, the higher the DC voltage of the frequency modulation control signal 16a, the wider becomes the depth of the depletion layer of the diode, thus decreasing the capacitance of the second variable capacitor element. Thus, it may be seen that the higher the DC potential, the lower becomes the frequency sensitivity of the voltage-controlled oscillator 10.

The carrier frequency in the voltage-controlled oscillator 100 shifts higher with the increasing DC potential of the frequency sensitivity control signal 12a. In the circuit configuration, shown in FIG. 3, the DC potential of the frequency sensitivity control signal 12a, supplied to the summation controller 16, rises with the increasing voltage applied to the input terminal 102 of the voltage-controlled oscillator 100. That is, the DC potential rises with the increasing carrier frequency.

Moreover, in the circuit shown in FIG. 3, the output in the form of AC amplitude of the CMFB circuit applied to the summation controller 16 is substantially not dependent on the carrier frequency. Thus, the increasing carrier frequency leads only to decreased frequency sensitivity of the second variable capacitor element $C_{MOD}$, which provides the frequency modulation of the voltage-controlled oscillator 100. As a result, the capacitance variation $\Delta C_{MOD}$ in the second variable capacitor element $C_{MOD}$ is decreased with the increasing carrier frequency.

When the carrier frequency is changed from 2.4 GHz to 2.5 GHz, it is desirable to satisfy, as an example, potential change from 1.80 V to 1.95 V in the frequency sensitivity control signal 12a. Such potential change may be achieved by selecting the weighting in summing the reference voltage signal $V_{ref}$ to the DC potential V (loop filter) within the non-inverting adder 12b of FIG. 3.

When the band shifts from 2.4 GHz to 2.5 GHz, the frequency sensitivity of the variable capacitor element $C_{MOD}$, responsible for frequency modulation of the voltage-controlled oscillator 100, maybe changed continuously, as mentioned above, so that the capacitance variation $\Delta C_{MOD}$ in the second variable capacitor element $C_{MOD}$ in the voltage-controlled oscillator 100 may be corrected such as to satisfy the aforementioned expression (3). It is thus possible with the voltage-controlled oscillator 100 to maintain the modulation degree to frequency uniformly, without having a resistive element in this circuit and dependency on the carrier frequency, as well as to avoid the noise generation. On the other hand, if there is constraint as to the upper and lower limits of the modulation degree to frequency, imposed by the pertinent radio standard, it is possible to expand the temperature and the power supply voltage, for which the integrated circuit chip may operate within the radio standard prescriptions, by an amount corresponding to the suppression of the carrier frequency dependency of the modulation degree to frequency.

Although the field-effect transistors are used in the present embodiment as the transistors, other types of devices such as bipolar transistors may also be used, provided that the circuitry is configured such that the capacitance changes of the variable capacitor element responsible for frequency modulation of the voltage-controlled oscillator will satisfy the expression (3) to correct the modulation degree to frequency. In the modifications, hereinafter described, no limitation is incurred to the type of the devices used, as well.

It is possible in this manner to add the DC voltage, generated for the carrier frequency sensitivity, to the DC voltage applied to the second variable capacitor element $C_{MOD}$, adapted for frequency modulation, and to control the DC voltage applied to the second variable capacitor element $C_{MOD}$, with rise in the carrier frequency, thereby correcting capacitance variations, in such a manner as to maintain the modulation degree to frequency of the voltage-controlled oscillator 10 without dependency on the carrier frequency.

A certain modification of the correction controller 10 is hereinafter described. In the modified correction controller 10, the frequency sensitivity controller 12 has been modified in configuration.

(First Modification)

Figure 5:
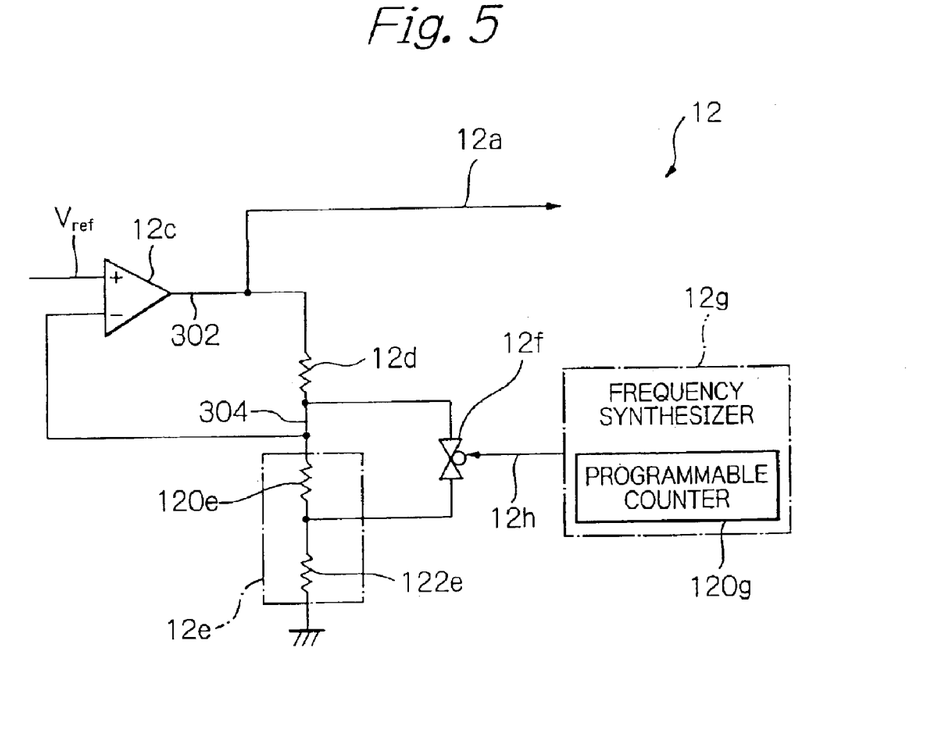
FIG. 5 is a schematic circuit diagram showing the configuration of a modification for the frequency sensitivity controller shown in FIG. 3.

With reference to FIG. 5, the frequency sensitivity controller 12 includes an operational amplifier 12c, resistors 12d and 12e, a transfer gate 12f and a frequency synthesizer 12g, interconnected as shown. The parts or components common to those of the previous embodiment are denoted with the same reference numerals and hence the description on the corresponding operation is omitted for simplicity. The resistor 12e, grounded, includes resistors 120e and 122e, which are connected in series with each other to establish the same resistance value as the resistor 12e of the embodiment shown in FIG. 3.

The transfer gate 12f is a switching element responsive to the control signal 12h supplied thereto for switching itself between the conductive and non-conductive states. The transfer gate 12f is connected in parallel with the resistor 120e. The transfer gate 12f operates responsive to the control signal 12h supplied from the frequency synthesizer 12g to be conductive in response to logical "low".

The frequency synthesizer 12g includes a voltage-controlled oscillator, a frequency divider, a reference frequency circuit, a phase comparator and a loop filter, not specifically shown in the figure. Among them, the frequency divider includes inside a programmable counter 120g, specifically shown in the figure, forming a portion of the phase synchronous loop circuit. The frequency division ratio of the frequency divider is changeable in dependence upon the value of the register of the programmable counter 120g. In the programmable counter 120g, data of the internal register are summed by a logical circuit and the so obtained logical sum output is electrically detected to determine whether or not the setting value of the oscillation frequency f of the frequency synthesizer 12g has reached the frequency f2. The logical sum output is to be the control signal 12h supplied to the transfer gate 12f. When the oscillation frequency f is larger than the frequency f2 or not, the transfer gate 12f is opened or closed in response to the control signal 12h, respectively. The control signal 12h may be an output of the logical summation, output by a register or registers of a specified bit position or positions of the programmable counter 120g.

The reference voltage signal $V_{ref}$ supplied to the operational amplifier 12c is obtained from a reference voltage circuit, not shown, having a reference based upon the bandgap width of a semiconductor device or a threshold value of the field-effect transistor. If the bandgap width is used as reference, the voltage value is generally approximately 1.2 V. In the instant embodiment, the reference voltage is divided by transistor resistors to set the reference voltage $V_{ref}$ to approximately 0.8 V. The resistance values of the resistor 12d, resistor 120e and the resistor 122e are 10 kΩ, 400 Ω and 6800 Ω, respectively.

Figure 6:
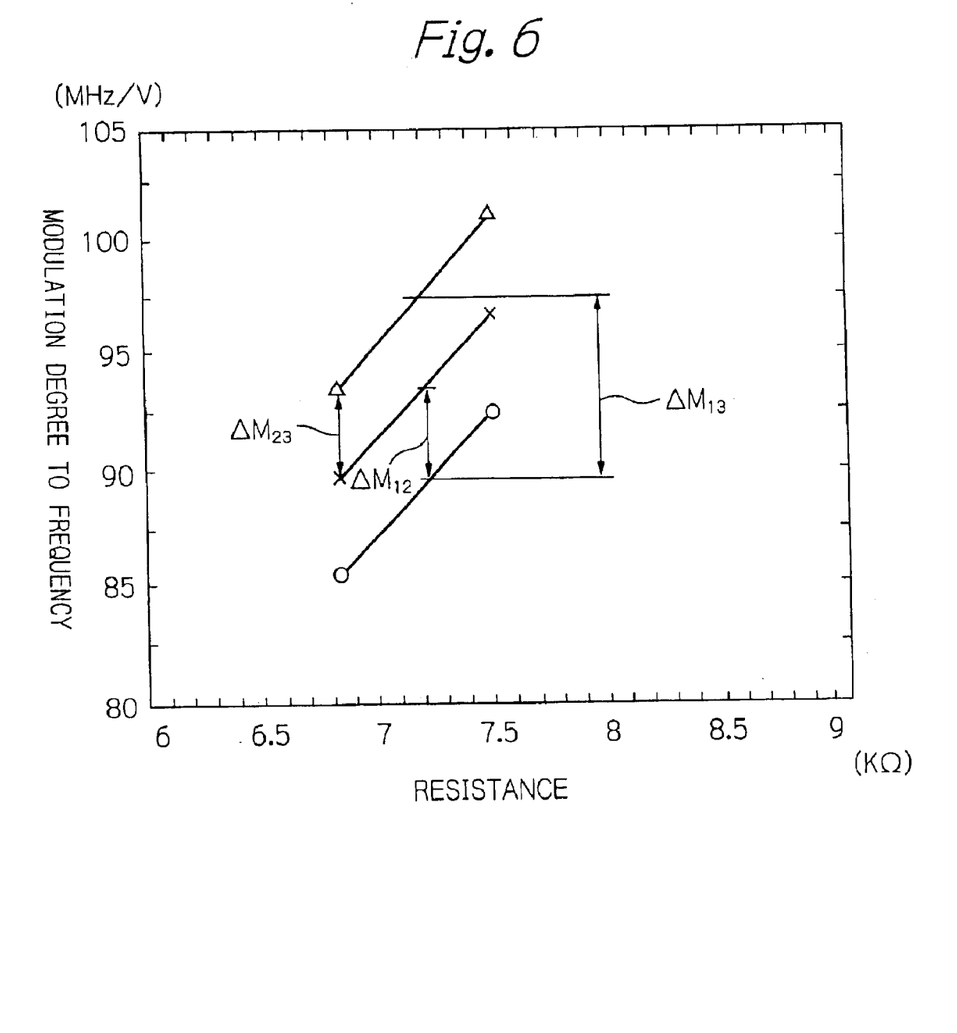
FIG. 6 is a graph plotting the modulation degree to frequency in the voltage-controlled oscillator with respect to external resistance for the different carrier frequencies in the correction controller of the configuration shown in FIG. 5.

The operation of the present modification is hereinafter described. FIG. 6 shows the relationship of the modulation degree to frequency (MHz/V) in the voltage-controlled oscillator 100 to a combined resistance (kΩ) of the resistors 120e and 122e of the correction controller 10, connected in series with each other. In the figure, circles, crosses and triangles indicate measured values for the carrier frequencies of f1=2402 MHz, f2=2441 MHz and f3=2480 MHz, respectively.

First, the operation of the transfer gate 12f is briefly described. Here, the frequency band of the carrier frequency extends from f1 to f3. The carrier frequency f2 is selected to be at a median point of the frequency range. The transfer gate 12f is closed for the carrier frequency less than the frequency f2 and open for the carrier frequency not less than the frequency f2.

When the carrier frequency f is lower than the frequency f2=2441 MHz, the transfer gate 12f is closed, so that the resistance value of the resister 12e of the operational amplifier 12c is 7200 Ω. It may be seen from FIG. 6 that, with the resistance value of 7200 Ω, the modulation degree to frequency is 89.5 kHz and 93.0 kHz for the frequency f1=2402 MHz and for the frequency f2=2441 MHz, respectively. Within this frequency band, the change in modulation degree to frequency $\Delta M_{12}$=(93.0−89.5)/89.5 is now 3.9%.

When the carrier frequency f is not less than the frequency f2, the transfer gate 12f is in its opened state, so that the resistance value of the resistor 12e associated with the operational amplifier 12c is approximately 6800 Ω which is resultant from the resistance value of the resistor 122e Since the grounding resistance is decreased, the DC potential V of the frequency sensitivity control signal 12a is raised. Thus, the voltage of the frequency modulation control signal 16a, output by the summation controller 16, is raised, so that the frequency sensitivity of the second variable capacitor element $C_{MOD}$ is decreased, taking charge of the frequency modulation. The modulation degree to frequency of the voltage-controlled oscillator 100 is accordingly decreased. With the resistance value of 6800 Ω, the frequency modulation index is 89.5 kHz and 93.0 kHz for the frequency f2=2441 MHz and for the frequency f3=2480 MHz, respectively. Thus, in this frequency range, the change in modulation degree to frequency $\Delta M_{23}$ is 3.9%.

In a comparative example, not shown, the resistance value of the resistor 12e grounding the output 12a of the operational amplifier 12c is fixed at 7200 Ω. In this case, the modulation degree to frequency changes by $\Delta M_{13}$=9.5% from 89.5 kHz for the frequency f1 to 98.0 kHz for the frequency f3. This variation is substantially coincident with the third power of the ratio (2480/2402), calculated from the above expression (3), or 10%.

This means that, by increasing the amplification factor of the operational amplifier 12c for increasing the voltage of the frequency modulation control signal 16a, supplied to the voltage-controlled oscillator 100, the modulation degree to frequency, which would have changed by $\Delta M_{13}$=10%, can be suppressed to the change $\Delta M_{23}$=3.9% of the modulation degree to frequency.

In the previous embodiment, the voltage of the frequency sensitivity control signal 12a is fed back to the non-inverting adder 12b for addition to the reference voltage signal $V_{ref}$. Since the paired junction diodes 116a and 116b (first variable capacitor element C) are subject to variations from one diode to another, the voltage value appearing in the frequency sensitivity control signal 12a and the oscillation frequency of the voltage-controlled oscillator 100 differ from one IC chip produced to another. The result is that, in such voltage-controlled oscillator 100 including the junction diodes 116a and 116b, the junction capacitance of which is deviated from the central value, the carrier frequency dependency of the modulation degree to frequency may not be operating in a designed fashion.

In the present embodiment, it is detected by the bit information from programmable counter 120g which carrier frequency it is. Thereby, the voltage value of frequency sensitivity control signal 12a is switched by the result of the detection. Even if it changes the capacity which the couple of junction diodes 116a and 116b has, the frequency sensitivity is not related to this change. The frequency sensitivity of the second variable capacitor element $C_{MOD}$, responsible for frequency modulation, thus can be changed over more reliably suppressing the carrier frequency dependency of the modulation degree to frequency on desired frequency.

(Second Modification)

Figure 7:
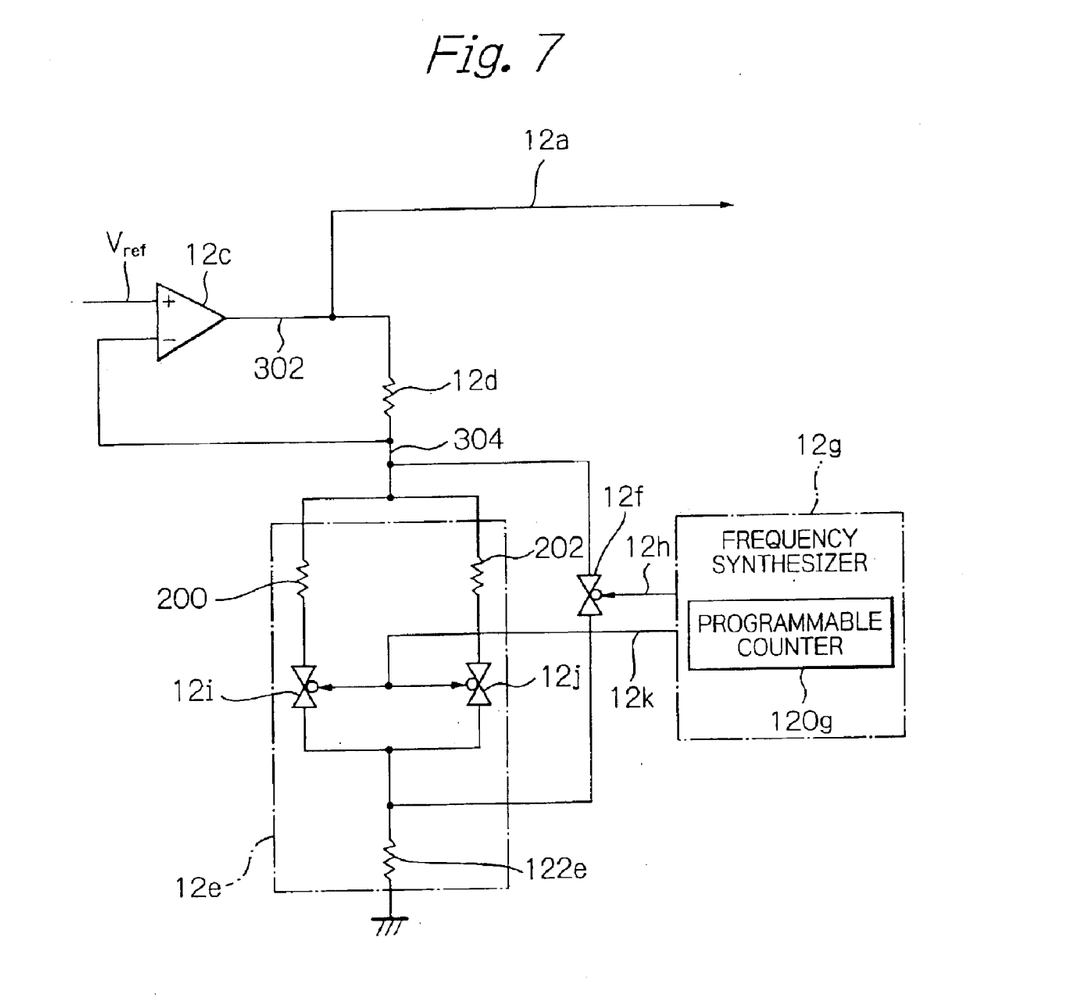
FIG. 7 is a schematic circuit diagram a configuration corresponding to a further modification of the frequency sensitivity controller shown in FIG. 5.

Referring to FIG. 7, the frequency sensitivity controller 12 includes an operational amplifier 12c, resistors 12d and 12e, transfer gates 12f, 12i and 12j, and a frequency synthesizer 12g. It is noted that the same reference numerals as those used in the previous embodiment or modification are used to designate the corresponding parts or components and the detailed description therefor is omitted for simplicity.

In the present embodiment, shown in FIG. 7, the resistor 12e is comprised of a parallel connection of a series connection of a resistor 200 and the transfer gate 12i and another series connection of a resistor 202 and the transfer gate 12j. The transfer gate 12f is connected in parallel across the resistors 12d and 122e, as in the previous embodiment.

The frequency synthesizer 12g is of the same configuration as in the first modification, and has the function of generating and outputting control signals 12h and 12k, adapted for opening and closing the transfer gates 12f, 12i and 12j. The control signal 12k, newly generated, is a signal for controlling the opening/closure of the transfer gates 12i and 12j.

Figure 8:
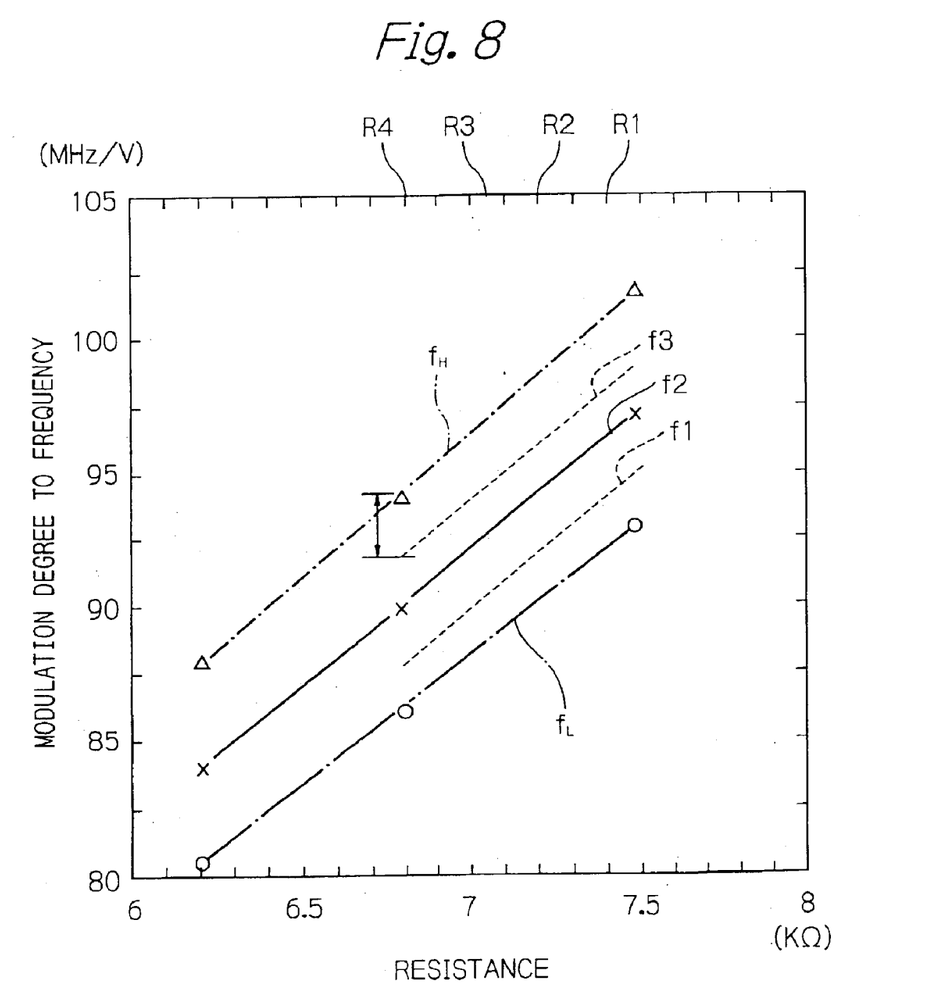
FIG. 8 is a graph showing the modulation degree to frequency in the voltage-controlled oscillator with respect to resistance determining the different carrier frequencies in the correction controller shown in FIG. 7.

Referring to FIG. 8, the operation of the correction controller 10 will be described in detail. In FIG. 8, the modulation degree to frequency (MHz/V) for the resistance (kΩ) of the resistor 12e is plotted for several values of the carrier frequency. The frequency band of the carrier frequency f is from $f_L$ to $f_H$. As intermediate frequencies in this frequency range, f1, f2 and f3 are set. In the present embodiment, $f_L$=2402 MHz, $f_H$=2480 MHz, f1=2420 MHz, f2=2441 MHz and f3=2455 MHz. The values of the modulation degree to frequency, as measured for the frequencies $f_L$, f2 and $f_H$ of the above carrier frequency values, are denoted by circles, crosses and triangles, respectively. In the present embodiment, the resistance values of the resistors 12d, 200, 202 and 122e are 10 kΩ, 600 Ω, 400 Ω and 6800 Ω, respectively.

As with the first modification, the transfer gates 12f, 12i and 12j operate in response to control signals 12h and 12k, generated depending on counts held in the programmable counter 120g. Initially, for the frequency range of $f_L$≦f<f1, in response to the programmable counter 120g, the transfer gates 12f and 12j are controlled to be turned off, while the transfer gate 12i is rendered conductive. The resistance value of the grounding resistor 12e in the operational amplifier 12c becomes 6800+600=7400 Ω. This resistance value is indicated by the point R1 in FIG. 8.

Second, for the frequency range of f1≦f<f2, the programmable counter 120g renders the transfer gates 12f and 12i off, while the transfer gate 12j on. At this time, the resistance value shown as R2 in FIG. 8 is 6800+400=7200 Ω.

Third, for the frequency range of f2≦f<f3, the programmable counter 120g controls the transfer gate 12f to be turned off, while the transfer gates 12i and 12j conductive. Since the resistors 200 and 202 are connected in parallel with each other, the resistance R3, shown in FIG. 8, is 6800+(600//400)=6800+240=7040 Ω.

Finally, for the frequency range of $f3 \leq f < f_H$, the programmable counter 120g controls the transfer gates 12i and 12j to be off, while the transfer gate 12f to be on. Since only the resistor 122e at this time is current conductive, the resistance value of R4 shown in FIG. 8 is 6800 Ω.

Thus, the measured results indicate that the values of the frequency sensitivity at the frequencies $F_L$ and f1 are 91.5 kHz and 93.5 kHz, respectively. The variation of the modulation degree to frequency in this frequency range is 2.2%. When the carrier frequency f is raised to f1, the grounding resistance of the operational amplifier 12c is lowered from 7400 Ω to 7200 Ω, so that the modulation degree to frequency reverts to 91.5 kHz. If next the carrier frequency f is raised to f2, the grounding resistance of the operational amplifier 12c is lowered from 7200 Ω to 7040 Ω, so that the modulation degree to frequency again reverts to 91.5 kHz. For the carrier frequency f in a range of $f3 \leq f < f_H$, the modulation degree to frequency is varied in a range of 91.5 kHz to 93.5 kHz. This modulation degree to frequency is reverted to 91.5 kHz by lowering the grounding resistance to 6800 Ω. The result is that the modulation degree to frequency is varied by 2.2% for the entire frequency range.

In the present embodiment, the number of the grounded side resistors in the resistor 12e for the operational amplifier 12c is increased by one as compared to the first modification. However, as for the switching of the modulation degree to frequency, with the use of the parallel connection of the transfer gates 12i and 12j and the resistors 200 and 202, the number of stages of switching the modulation degree to frequency may be increased to four from two of the previous embodiment, thus doubling the number of the degrees of freedom. As a result, the variation of the modulation degree to frequency for the entire frequency range is 2.2% for the entire frequency range, in contradistinction from the variation in the modulation degree to frequency in the first modification of 3.9% for the entire frequency range, and hence the variation can be suppressed to about one half of that of the first modification.

(Third Modification)

The third modification will now be described. In the present embodiment, the frequency sensitivity controller 12, shown in FIG. 3, is applied so as to change the amplification factor of the frequency modulation controller 14 as shown in FIG. 9.

Figure 9:
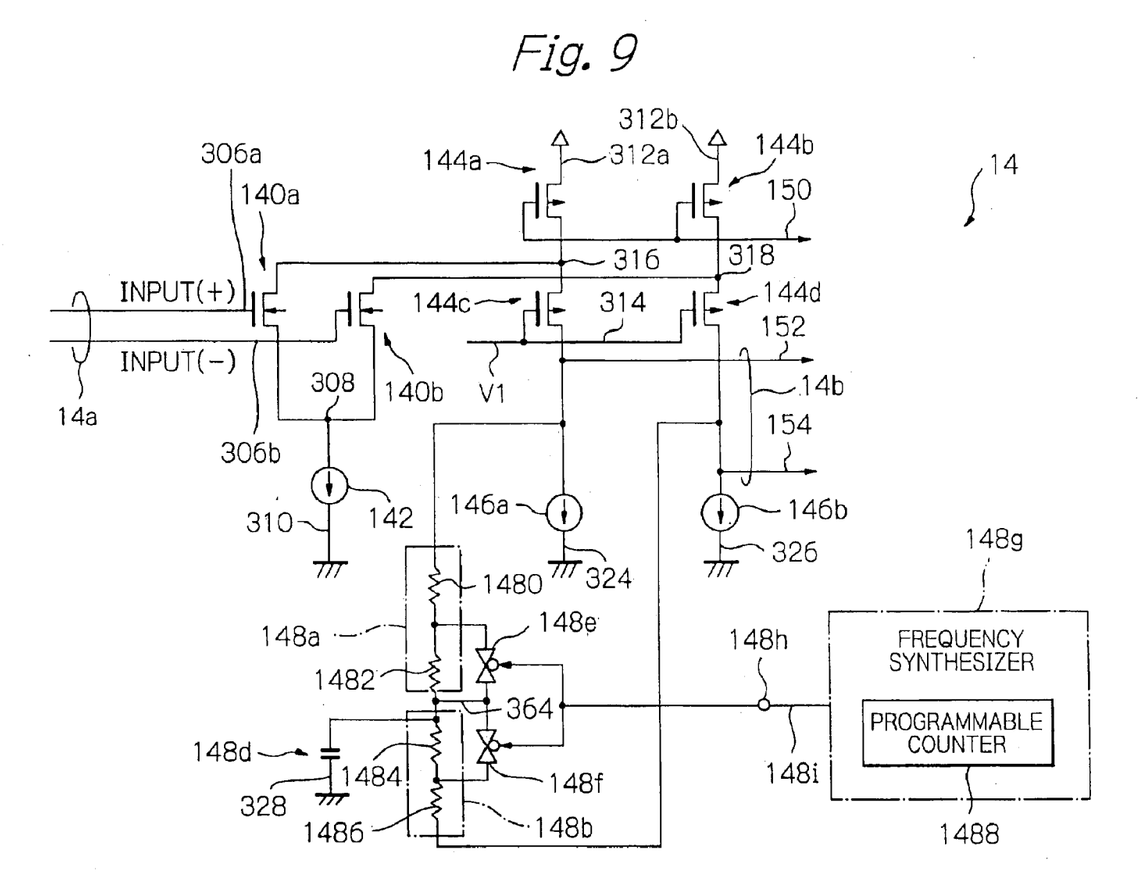
FIG. 9 is a schematic circuit diagram showing the configuration of a modification of the frequency sensitivity controller shown in FIG. 3.

The frequency modulation controller 14 is basically similar to the configuration shown in FIG. 3 except that resistors 148a and 148b, transfer gates 148e and 148f, and a frequency synthesizer 148g have been added in the frequency modulation controller 14 shown in FIG. 9.

The resistor 148a includes a series connection of resistors 1480 and 1482, while the resistor 148b includes a series connection of resistors 1484 and 1486. The transfer gates 148e and 148f are connected in parallel with the resistors 1482 and 1484, respectively. The nodes 364 of the parallel connection of the transfer gates 148e and 148f are connected in common.

The frequency synthesizer 148g includes a programmable counter 1488 which forms a component of a frequency divider included therein. The programmable counter 1488 sends out a control signal 148i via control terminal 148h to the transfer gates 148e and 148f. The transfer gates 148e and 148f perform switching responsive to the control signal 148i supplied thereto. The control signal 148i is a logical sum output of plural bit data or output bit data of the programmable counter 1488. The resistance value of the transfer gates 148e and 148f during the conductive states thereof is smaller than the resistance value of the resistor 1482 or 1484 by a factor of ten at least.

In the present embodiment, the reference voltage is divided by transistor resistors to a voltage value $V_{ref}$ of 0.9 V. The resistance values of the resistors 1480 and 1486 are equal to each other and 2800 Ω, while the resistance values of the resistors 1482 and 1484 are equal to each other and 130 U. The resistance value of the former resistor set is about 21 times as large as that of the latter resistors. The resistance values of the resistors 12d and 12e in the frequency sensitivity controller 12, not shown, are 7500Ω and 6200Ω, respectively, while the output of the operational amplifier 12c is 2.0 V.

The operation of the present modification will now be described. Here again, the frequency range of the carrier frequency is set to from frequency f1 to frequency f3, with a median frequency of the frequency range being f2. In the present embodiment, the frequencies f1, f2 and f3 are again set to 2402 MHz, 2441 MHz and 2480 MHz, respectively. When the carrier frequency f is less than the frequency f2 or not, the transfer gate 148e of FIG. 9 is controlled to its open or closed state, respectively. Since the detailed operation is similar to the operation of the first modification, shown in FIG. 5, the explanation relevant to the frequency is omitted for simplicity.

In the circuit operation, when the AC voltages (+) and (−) are given as input 14a to the gate electrodes 306a and 360b of the NMOS transistors 140a and 140b, respectively, the currents flowing through the PMOS transistors 144c and 144d are varied with the same frequency as that of the input 14a. Since constant current source circuits 146a and 146b are connected to the drain electrodes 152 of the PMOS transistors 144c and 144d, respectively, the current differential through the PMOS transistors 144c and 144d is corrected by the current flowing from the resistor 1480 through to the resistor 1486. Thus, the voltage amplitude of the AC signal applied to the input terminal 104 of the voltage-controlled oscillator 100 is approximately proportionate to the series resistance from the resistor 1480 through to the resistor 1486.

With opening/closure of the transfer gates 148e and 148f, the voltage amplitude of the AC signal of the voltage-controlled oscillator 100 when the carrier frequency f is not less than f2 is 20/21 times the amplitude when the carrier frequency f is lower than f2. In the absence of opening/closure of the transfer gates, the modulation degree to frequency would be varied by approximately 10% with the increasing carrier frequency, in accordance with the expression (3). With the present embodiment, such change in the modulation degree to frequency can be suppressed to approximately 5%.

The frequency modulation control signal 16a, supplied to the voltage-controlled oscillator 100, may be generated as the DC and AC components thereof are controlled independently of each other. The temperature and supply power source voltage dependency of the modulation degree to frequency of the voltage-controlled oscillator 100 can be suppressed by properly selecting design parameters such as to cancel out this dependency using the reference voltage signal $V_{ref}$ of the operational amplifier 12c of FIG. 9.

Since the carrier frequency dependency of the modulation degree to frequency in the voltage-controlled oscillator 100 can be changed independently of the DC component of the reference voltage signal $V_{ref}$, respective degrees of freedom of independently correcting the carrier frequency dependency, temperature dependency and the power supply voltage dependency of the modulation degree to frequency may be achieved, thus assuring facilitated circuit designing as compared to that for the circuit arrangement of the previous embodiments.

In the above-described configuration, the DC voltage applied for carrier frequency sensitivity may be summed to the DC voltage applied to the second variable capacitor element $C_{MOD}$ for frequency modulation, and the DC voltage applied to the second variable capacitor element $C_{MOD}$ may be controlled with the increasing carrier frequency to correct capacitance changes to maintain the modulation degree to frequency uniformly without dependency on the carrier frequency. This also allows a tolerance to be established for possible noise increase.

The DC voltage applied to the second variable capacitor element $C_{MOD}$ responsible for frequency modulation can be changed over between two values by frequency setting data provided in the frequency synthesizer to control the DC voltage applied to the second variable capacitor element $C_{MOD}$ responsible for frequency modulation, with the increasing carrier frequency, such as to suppress the carrier frequency dependency of the modulation degree to frequency more reliably.

Moreover, the resistor determining the DC voltage applied to the second variable capacitor element $C_{MOD}$ responsible for frequency modulation is divided into parallel circuits, and by the frequency setting data provided in the frequency synthesizer the DC voltage applied to the variable capacity for frequency modulation is changed over to a number of stages larger than the number of resistance division. The correction controller 10 can thus realize increasing degree of freedom and appreciably suppress variations over the entire range caused with the modulation degree to frequency.

By changing the amplitude of the AC signal applied to the second variable capacitor element $C_{MOD}$ for frequency modulation, in keeping with the carrier frequency, independently of the DC potential relevant to this capacitor element $C_{MOD}$, there may be provided a degree of freedom of correcting the carrier frequency dependency, temperature dependency and the power supply voltage dependency of the modulation degree to frequency, thus assuring a facilitated circuit designing.

The entire disclosure of Japanese patent application No. 2002-172484 filed on Jun. 13, 2002 including the specification, claims, accompanying drawings and abstract of the disclosure is incorporated herein by reference in its entirety.

While the patent invention has been described with reference to the particular illustrative embodiments it is not to be restricted by the embodiments. It is to be appreciated that those skilled in the art can change or modify the embodiments without departing from the scope and spirit of the present invention.

What is claimed is:

1. A frequency modulation corrector for use with a voltage-controlled oscillator including a parallel connection of a first capacitor element having a capacitance changeable with a first control voltage signal controlling an oscillation frequency and a second capacitor element having a capacitance changeable with a second control voltage signal controlling frequency modulation, comprising:

a frequency setting circuit for generating and outputting DC signals based on a predetermined reference voltage signal and on a voltage signal which is in keeping with a desired frequency;

a modulation degree setting circuit for amplifying AC signals and for generating and outputting a modulation adjusting signal used for controlling the degree of the frequency modulation; and a signal summation circuit for summing the DC signals and the modulation adjusting signal to generate and output the second control voltage signal;

said frequency modulation correction circuit being arranged outwardly of said voltage-controlled oscillator.

2. The corrector in accordance with claim 1, wherein said frequency setting circuit comprises:

an addition circuit for adding the preset reference voltage signal $V_{ref}$ to a first control voltage signal which is output from said voltage-controlled oscillator which has been subjected to frequency selection processing; and an amplifier circuit for generating the DC signal from an output signal which is output from said addition circuit and a voltage signal representing an amplification factor of the output signal.

3. The corrector in accordance with claim 1, wherein said frequency setting circuit comprises an amplifier circuit for generating the DC signals supplied to said signal summation circuit;

said amplifier circuit comprising:

an amplification decision circuit responsive to the predetermined reference voltage signal and a voltage signal representing the amplification factor of said amplifier circuit for determining whether or not amplification is to be made based on the amplification factor; and a frequency determining circuit for counting signals obtained on oscillation of a voltage-controlled oscillating circuit included in said frequency setting circuit independently of the voltage-controlled oscillator to determine whether or not the signals are of a preset frequency, and for sending out to said amplification decision circuit a control signal representing whether or not the amplification is to be performed based on a result of determination.

4. The corrector in accordance with in claim 1, wherein said frequency setting circuit comprises an amplifier circuit for generating the DC signals to be supplied to said signal summation circuit;

said amplifier circuit comprising:

a plurality of amplification decision circuits for determining, for a plurality of frequencies, whether or not amplification is to be performed for each of the plurality of frequencies, based on the predetermined reference voltage signal and the voltage signal representing an amplification factor of said amplifier circuit; and a plurality of frequency determining circuits responsive to said plurality of amplification decision circuits for counting signals obtained on oscillations of a voltage-controlled oscillating circuit included in said frequency setting circuit independently of the voltage-controlled oscillator to determine whether or not an oscillation frequency output from said voltage-controlled oscillating circuit is of each predetermined frequency, and for sending out to each of said plurality of amplification decision circuits a control signal representing whether or not the amplification is to be performed based on a result of determination.

5. The corrector in accordance with in claim 3, wherein said frequency setting circuit comprises an amplifier circuit for generating the DC signals to be supplied to said signal summation circuit;

said amplifier circuit comprising:

a plurality of amplification decision circuits for determining, for a plurality of frequencies, whether or not amplification is to be performed for each of the plurality of frequencies, based on the predetermined reference voltage signal and the voltage signal representing an amplification factor of said amplifier circuit; and a plurality of frequency determining circuits responsive to said plurality of amplification decision circuits for counting signals obtained on oscillations of the voltage-controlled oscillating circuit to determine whether or not an oscillation frequency output from said voltage-controlled oscillating circuit is of each predetermined frequency, and for sending out to each of said plurality of amplification decision circuits a control signal representing whether or not the amplification is to be performed based on a result of determination.

6. The corrector in accordance with claim 1, wherein said modulation degree setting circuit comprises a suppression circuit for suppressing a second control voltage signal depending on a frequency to be modulated;

said suppression circuit comprising:

a suppression decision circuit for determining whether or not an amplitude of the AC signals is to be suppressed; and a frequency decision circuit for determining, using a count output of the oscillation frequency, whether or not the oscillation frequency of a voltage-controlled oscillating circuit included in said modulation degree setting circuit independently of the voltage-controlled oscillator, and for sending out to said suppression decision circuit a control signal representing whether or not the amplitude is to be suppressed based on a result of determination.

7. The corrector in accordance with claim 2, wherein said modulation degree setting circuit comprises a suppression circuit for suppressing a second control voltage signal depending on a frequency to be modulated;

said suppression circuit comprising:

a suppression decision circuit for determining whether or not an amplitude of the AC signals is to be suppressed; and a frequency decision circuit for determining, using a count output of the oscillation frequency, whether or not the oscillation frequency of a voltage-controlled oscillating circuit included in said modulation degree setting circuit independently of the voltage-controlled oscillator, and for sending out to said suppression decision circuit a control signal representing whether or not the amplitude is to be suppressed based on a result of determination.

8. The corrector in accordance with claim 3, wherein said modulation degree setting circuit comprises a suppression circuit for suppressing a second control voltage signal depending on a frequency to be modulated;

said suppression circuit comprising:

a suppression decision circuit for determining whether or not an amplitude of the AC signals is to be suppressed, and a frequency decision circuit for determining, using a count output of the oscillation frequency, whether or not the oscillation frequency of the voltage-controlled oscillating circuit, and for sending out to said suppression decision circuit a control signal representing whether or not the amplitude is to be suppressed based on a result of determination.

9. The corrector in accordance with claim 4, wherein said modulation degree setting circuit comprises a suppression circuit for suppressing a second control voltage signal depending on a frequency to be modulated;

said suppression circuit comprising:

a suppression decision circuit for determining whether or not an amplitude of the AC signals is to be suppressed, and a frequency decision circuit for determining, using a count output of the oscillation frequency, whether or not the oscillation frequency of the voltage-controlled oscillating circuit, and for sending out to said suppression decision circuit a control signal representing whether or not the amplitude is to be suppressed based on a result of determination.

* * * * *